United States Patent
Fujioka (10) Patent No.: US 11,423,955 B2
(45) Date of Patent: Aug. 23, 2022

(54) MEMORY DEVICE AND METHOD FOR INPUT AND OUTPUT BUFFER CONTROL THEREOF

(71) Applicant: Winbond Electronics Corp., Taichung (TW)

(72) Inventor: Shinya Fujioka, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/373,787

(22) Filed: Jul. 13, 2021

(65) Prior Publication Data

US 2022/0020401 A1    Jan. 20, 2022

(30) Foreign Application Priority Data

Jul. 17, 2020    (JP) .............................. JP2020-122653

(51) Int. Cl.
  *G11C 7/06*    (2006.01)
  *G11C 7/10*    (2006.01)
  *G11C 5/14*    (2006.01)

(52) U.S. Cl.
  CPC ............... *G11C 7/062* (2013.01); *G11C 5/14* (2013.01); *G11C 7/109* (2013.01); *G11C 7/1057* (2013.01); *G11C 7/1063* (2013.01); *G11C 7/1084* (2013.01)

(58) Field of Classification Search
  CPC ........................................................ G11C 7/06
  USPC ..................................................... 365/185.21
  See application file for complete search history.

(56) References Cited

U.S. PATENT DOCUMENTS

| 6,934,200 | B2 | 8/2005 | Bhat et al. |
| 9,711,192 | B2* | 7/2017 | Kim ..................... G11C 5/147 |
| 10,236,042 | B2* | 3/2019 | Eaton .................... H04L 7/0008 |
| 2009/0154257 | A1* | 6/2009 | Fujioka .............. G11C 11/4076 365/189.11 |
| 2010/0157697 | A1 | 6/2010 | Sato |

(Continued)

FOREIGN PATENT DOCUMENTS

| CN | 109285581 | 1/2019 |
| JP | 4106907 | 6/2008 |
| KR | 19990017367 | 3/1999 |

(Continued)

OTHER PUBLICATIONS

"Office Action of Taiwan Counterpart Application", dated Dec. 29, 2020, p. 1-p. 6.

(Continued)

*Primary Examiner* — Muna A Techane
(74) *Attorney, Agent, or Firm* — JCIPRNET (57) ABSTRACT

A memory device and a method for input/output buffer control are provided. The memory device includes a pseudo static random access memory and a controller. The pseudo static random access memory includes an input/output circuit having a fast mode circuit and a slow mode circuit. The controller adjusts a power supply voltage and a clock frequency according to an operation mode of the memory device, and generates a register setting code based on an adjusted power supply voltage and an adjusted clock frequency. The pseudo static random access memory enables one of the fast mode circuit and the slow mode circuit according to the register setting code, and disables the other of the fast mode circuit and the slow mode circuit.

13 Claims, 8 Drawing Sheets

(56) References Cited

U.S. PATENT DOCUMENTS

2019/0197658 A1    6/2019   Jasoliya
2020/0075086 A1*   3/2020   Hou .................. G11C 11/40615

FOREIGN PATENT DOCUMENTS

| KR | 20030045155 | 6/2003 |
| KR | 20040103012 | 12/2004 |
| KR | 101915005 | 1/2019 |
| TW | I454900 | 10/2014 |
| TW | I589032 | 6/2017 |

OTHER PUBLICATIONS

"Office Action of Korea Counterpart Application", dated Sep. 30, 2021, p. 1-p. 12.
"Office Action of Korea Counterpart Application", with English translation thereof, dated Apr. 27, 2022, p. 1-p. 11.

* cited by examiner

MEMORY DEVICE AND METHOD FOR INPUT AND OUTPUT BUFFER CONTROL THEREOF

CROSS-REFERENCE TO RELATED APPLICATION

This application claims the priority benefit of Japan application serial no. 2020-122653, filed on Jul. 17, 2020. The entirety of the above-mentioned patent application is hereby incorporated by reference herein and made a part of this specification.

BACKGROUND

Technical Field

The disclosure relates to a semiconductor circuit, and in particular, to a memory device and a method for input/output buffer control thereof.

Description of Related Art

In recent years, a low pin count memory (LPC memory) has been widely used in the Internet of Things (IoT) and wearable devices. However, because the low pin count memory needs to be operated at a high clock frequency, an input/output circuit (IO circuit) of the low pin count memory consumes a large amount of current. In addition, in the conventional technology, the access time is unrelated to the clock frequency, and the current driving force is controlled independently of the operation mode and the clock frequency, thereby resulting in shortening of the battery life.

SUMMARY

In view of this, the invention provides a memory device and a method for input/output buffer control thereof used to generate a register setting code according to a power supply voltage and a clock frequency, and to enable a fast mode circuit or a slow mode circuit in an input/output circuit according to the register setting code, to dynamically adjust an access time of the input/output circuit, thereby providing power saving control and prolonging a battery life.

An embodiment of the invention provides a memory device. The memory device includes a pseudo static random access memory and a controller. The pseudo static random access memory includes an input/output circuit having a fast mode circuit and a slow mode circuit. The controller is coupled to the pseudo static random access memory, configured to adjust a power supply voltage and a clock frequency according to an operation mode of the memory device, and generate a register setting code based on an adjusted power supply voltage and an adjusted clock frequency. The pseudo static random access memory enables one of the fast mode circuit and the slow mode circuit according to the register setting code, and disables the other of the fast mode circuit and the slow mode circuit.

An embodiment of the invention provides a method for input/output buffer control adapted for a memory device, and the memory device includes a pseudo static random access memory and a controller. The pseudo static random access memory includes an input/output circuit having a fast mode circuit and a slow mode circuit. The method for input/output buffer control includes: adjusting a power supply voltage and a clock frequency according to an operation mode of the memory device; generating a register setting code based on an adjusted power supply voltage and an adjusted clock frequency; and enabling one of the fast mode circuit and the slow mode circuit according to the register setting code, and disabling the other of the fast mode circuit and the slow mode circuit.

Based on the foregoing, in the embodiments of the invention, the memory device and the method for input/output buffer control thereof are used to adjust the power supply voltage and the clock frequency according to the operation mode, and generate the register setting code based on the adjusted power supply voltage and the adjusted clock frequency, and enable the fast mode circuit or the slow mode circuit in the input/output circuit according to the register setting code to dynamically adjust an access time of the input/output circuit, thereby providing power saving control and prolonging a battery life.

To make the foregoing features and advantages of the present invention clearer and easier to understand, a detailed description is made below by using listed embodiments with reference to the accompanying drawings.

DESCRIPTION OF THE EMBODIMENTS

Figure 1:
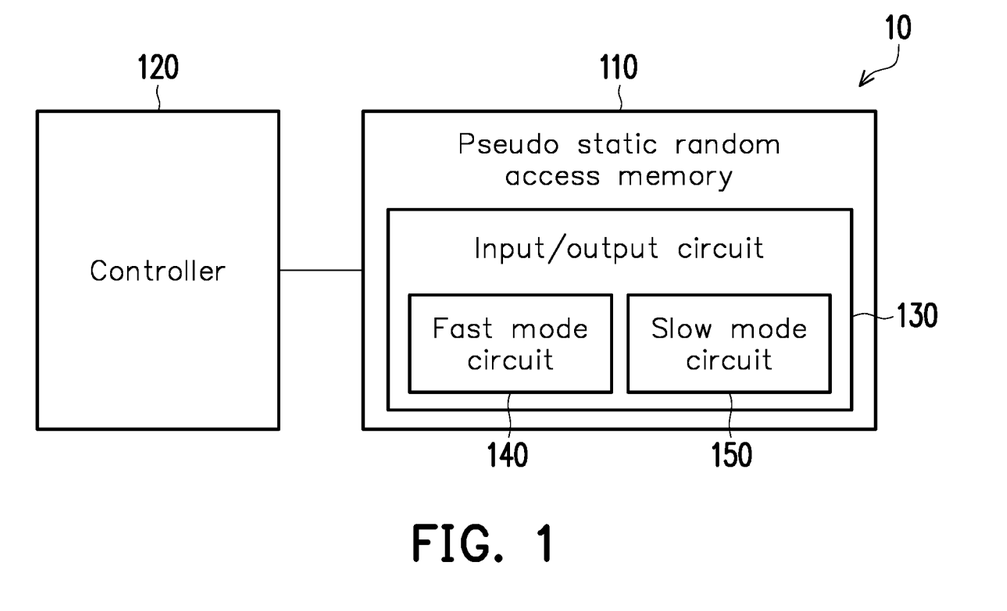
FIG. 1 is a schematic diagram of a memory device according to an embodiment of the invention.

Referring to FIG. 1, a memory device 10 may include a pseudo static random access memory 110 and a controller 120. The pseudo static random access memory 110 includes an input/output circuit 130. The input/output circuit 130 includes a fast mode circuit 140 and a slow mode circuit 150. The controller 120 is coupled to the pseudo static random access memory 110.

In different embodiments, the memory device 10 may be an octal flash memory, a ferroelectric random access memory (FRAM), an electrically-erasable programmable read-only memory (EEPROM) or other memories.

Figure 2:
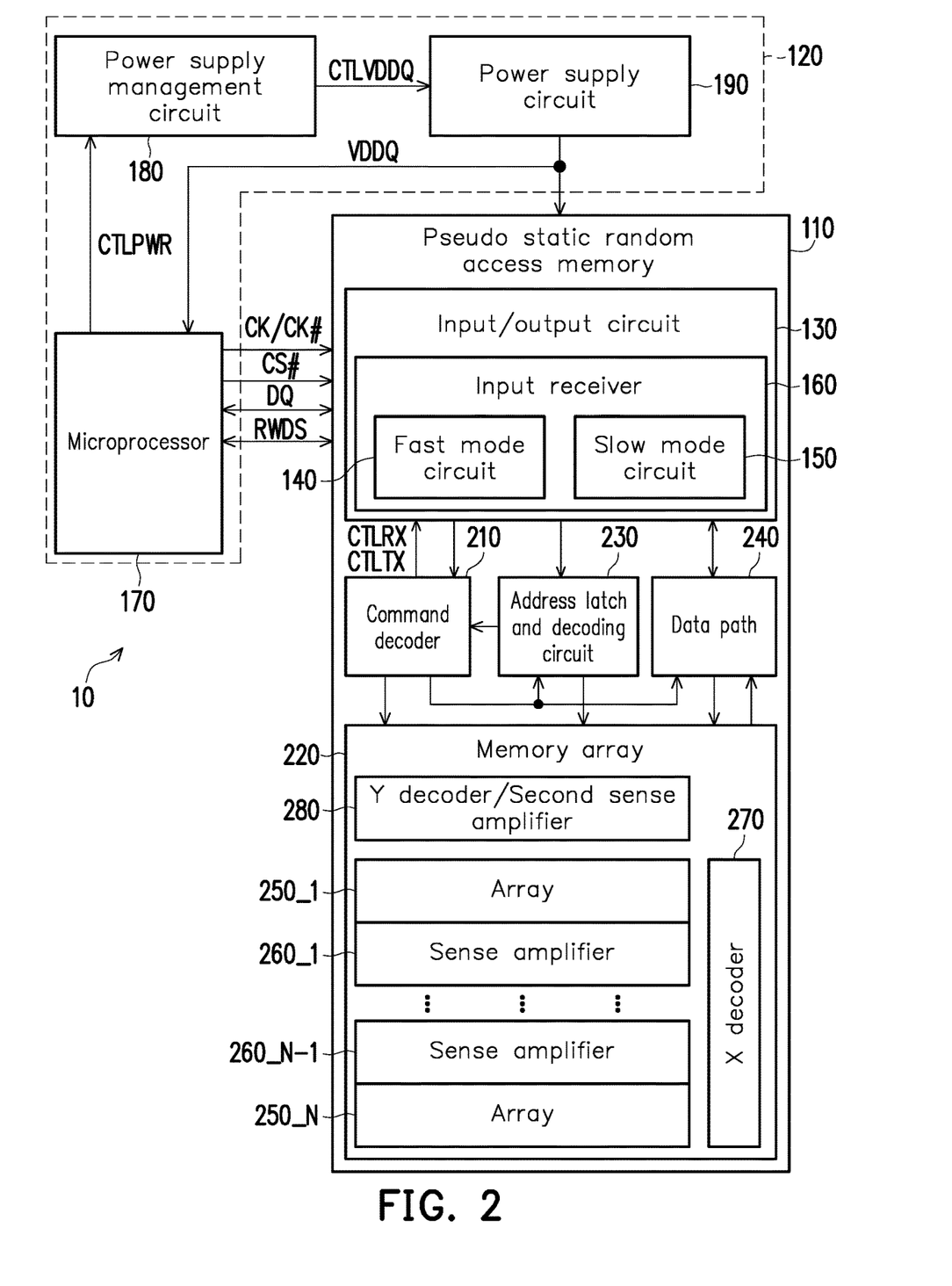
FIG. 2 is a circuit block diagram of a pseudo static random access memory according to an embodiment of the invention.

Referring to FIG. 2, the pseudo static random access memory 110 includes an input/output circuit 130, a command decoder 210, and a memory array 220. The input/output circuit 130 is coupled to the command decoder 210 and serves as an input/output interface between an internal circuit and an external circuit of the pseudo static random access memory 110. Further, the input/output circuit 130 includes an input receiver 160, and the input receiver 160 includes a fast mode circuit 140 and a slow mode circuit 150. The command decoder 210 is coupled between the input/output circuit 130 and the memory array 220. The command decoder 210 is configured to decode a register setting code CR received from the controller 120 and generate the input control signal CTLRX and the transmission control signal CTLTX. The memory array 220 is composed of a plurality of storage units, and performs data write or read control on a storage unit designated by the microprocessor 170. In an embodiment, the pseudo static random access memory 110 may be composed of a dynamic random access memory (DRAM) as a core and a static random access memory (SRAM) as an interface. In an embodiment, the pseudo static random access memory 110 may further include other devices, such as an address latch and decoding circuit 230 and a data path 240, but the invention is not limited thereto. In an embodiment, the memory array 220 includes an array 250_1, a sense amplifier 260_1 . . . , a sense amplifier 260_N−1, an array 250_N, an X decoder 270, and a Y decoder/second sense amplifier 280.

Referring to FIG. 2, the controller 120 includes a microprocessor 170, a power supply management circuit 180, and a power supply circuit 190.

The microprocessor 170 is coupled to the pseudo static random access memory 110, and the microprocessor 170 provides a differential clock signal CK, a differential clock signal CK#, and a chip selection signal CS# to the pseudo static random access memory 110. There is also a bidirectional data bus DQ and a read-write data strobe signal RWDS between the pseudo static random access memory 110 and the microprocessor 170. In detail, for clock frequency adjustment of the differential clock signal CK and the differential clock signal CK#, the microprocessor 170 generates a power supply management control signal CTLPWR according to an operation mode of the memory device 10 and adjusts the clock frequency. For example, when a low power consumption mode is pointed to, the frequency is adjusted from 400 MHz to 133 MHz. In addition, the microprocessor 170 generates a corresponding command address bit CA and a register setting code CR according to a change in the clock frequency. According to design requirements, the microprocessor 170 may be a central processing unit (CPU), a programmable microprocessor, a digital signal processor (DSP), a programmable controller, an application specific integrated circuit (ASIC), or other similar elements or a combination of the foregoing elements.

The power supply management circuit 180 is coupled to the microprocessor 170, and the power supply management circuit 180 generates a power supply control signal CTLVDDQ according to the power supply management control signal CTLPWR. For example, when the microprocessor 170 indicates entering of a low power consumption mode, the microprocessor 170 sends a high logic-level power supply management control signal CTLPWR to the power supply management circuit 180. Next, the power supply management circuit 180 sends a low logic-level power supply control signal CTLVDDQ to the power supply circuit 190 according to the high logic-level power supply management control signal CTLPWR.

The power supply circuit 190 is coupled to the pseudo static random access memory 110, the microprocessor 170, and the power supply management circuit 180. The power supply circuit 190 generates a power supply voltage VDDQ according to the power supply control signal CTLVDDQ and provides the power supply voltage VDDQ to the microprocessor 170 and the pseudo static random access memory 110. Following the foregoing example, when the power supply circuit 190 receives the low logic-level power supply control signal CTLVDDQ, the power supply voltage VDDQ is increased for the power supply circuit 190 and provided to the microprocessor 170 and the pseudo static random access memory 110. For example, the power supply voltage VDDQ is increased from 1.2 V to 1.8 V.

On the contrary, when the microprocessor 170 indicates entering of a fast mode, the microprocessor 170 sends a low logic-level power supply management control signal CTLPWR to the power supply management circuit 180. Next, the power supply management circuit 180 sends a high logic-level power supply control signal CTLVDDQ to the power supply circuit 190 according to the low logic-level power supply management control signal CTLPWR. When the power supply circuit 190 receives the high logic-level power supply control signal CTLVDDQ, the power supply voltage VDDQ is decreased for the power supply circuit 190 and provided to the microprocessor 170 and the pseudo static random access memory 110. For example, the power supply voltage VDDQ is decreased from 1.8 V to 1.2 V.

Figure 3A:
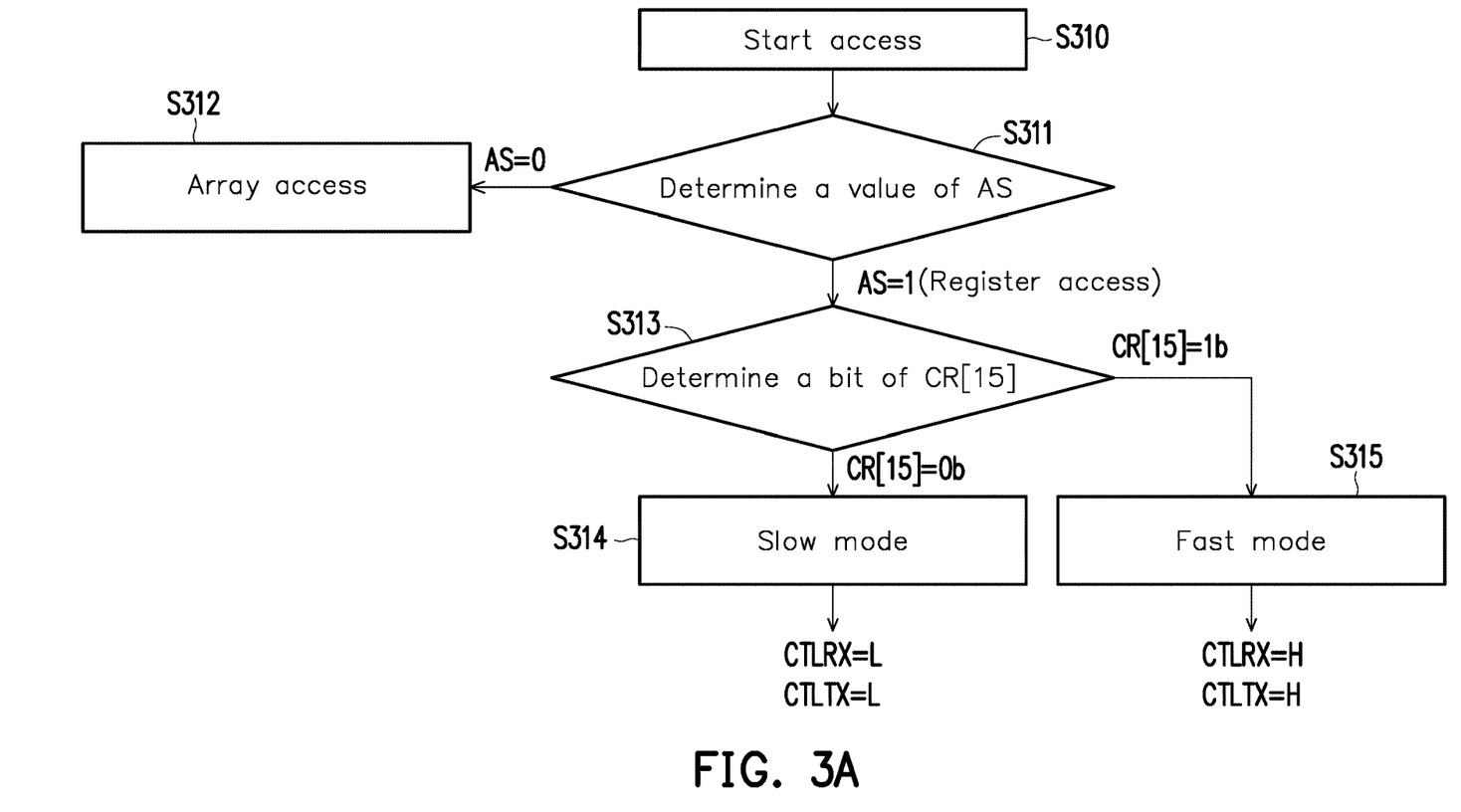
FIGS. 3A and 3B are flowcharts for determining a command address bit according to the embodiments of the invention.

Referring to FIG. 3A, in step S310, a memory device 10 starts access. Next, in step S311, a command decoder 210 in the pseudo static random access memory 110 determines whether access is memory access (AS=0) or register access (AS=1) according to an address space bit AS in a command address bit CA. When the access is the memory access (AS=0), perform step S312, and when the access is the register access (AS=1), perform step S313. In step S312, the memory device 10 performs array access on a memory array 220. In step S313, the memory device 10 performs register access on the command decoder 210 and determines an operation mode CR[15] in a register setting code CR stored in the command decoder 210. When a set mode CR[15] is 0 b, perform step S314. When the set mode CR[15] is 1 b, perform step S315. For details of the set mode CR[15] in the register setting code CR, refer to Table 1.

TABLE 1

| Register setting code CR | Function | Setting (binary bit) |
| --- | --- | --- |
| CR[15] | Operation mode | 1b: Fast mode |
| | | 0b: Slow mode |
| CR[14:12] | Current driving force | 000b: 34 ohm |
| | | 001b: 115 ohm |
| | | 010b: 67 ohm |
| CR[11:8] | Reserved | N/A |
| CR[7:4] | Delay count | 0000b: 5 clocks, 133 MHz |
| | | 0001b: 6 clocks, 160 MHz |
| | | 0010b: 7 clocks, 200 MHz |
| | | 0011b: 8 clocks, 250 MHz |
| | | 0100b: 12 clocks, 333 MHz |
| | | 0101b: 14 clocks, 400 MHz |
| | | 0110b: 16 clocks, 500 MHz |
| | | 0111b-: Reserved |
| CR[3:0] | Reserved | N/A |

In step S314, it means that an input/output circuit 130 is determined to be operated in a slow mode, and the command decoder 210 outputs a low logic-level input control signal CTLRX (that is, CTLRX=L) and a low logic-level transmission control signal CTLTX (that is, CTLTX=L). In step S315, it means that the input/output circuit 130 is determined to be operated in a fast mode, and the command decoder 210 outputs a high logic-level input control signal CTLRX (that is, CTLRX=H) and a high logic-level transmission control signal CTLTX (that is, CTLTX=H).

Figure 3B:
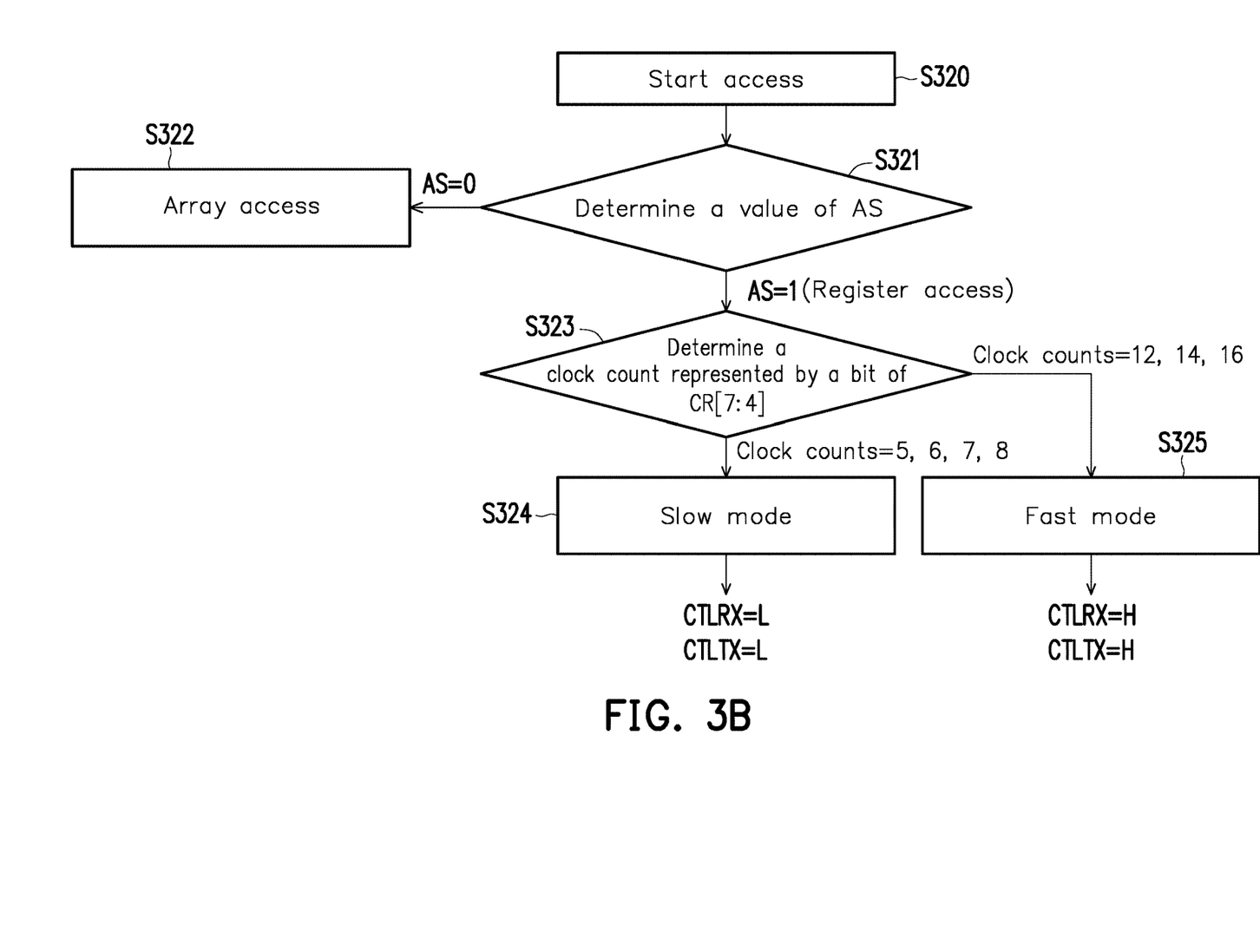

Referring to FIG. 3B, in step S320, a memory device 10 starts access. Next, in step S321, a command decoder 210 in a pseudo static random access memory 110 determines whether access is memory access (AS=0) or register access (AS=1) according to an address space bit AS in a command address bit CA. When the access is the memory access (AS=0), perform step S322, and when the access is the register access (AS=1), perform step S323. In step S322, the memory device 10 performs array access on a memory array 220. In step S323, the memory device 10 performs the register access on the command decoder 210, and determines the delay count CR [7:4] in the register setting code CR stored in the command decoder 210. When the delay count CR [7:4] includes 5, 6, 7, and 8 clocks, perform step S324. When the delay count CR [7:4] includes 12, 14, 16 clocks, perform step S325. For details of the delay count CR [7:4] in the register setting code CR, refer to Table 1. In step S324, it means that an input/output circuit 130 is determined to be operated in the slow mode, and the command decoder 210 outputs a low logic-level input control signal CTLRX (that is, CTLRX=L) and a low logic-level transmission control signal CTLTX (that is, CTLTX=L). In step S325, it means that the input/output circuit 130 is determined to be operated in the fast mode, and the command decoder 210 outputs a high logic-level input control signal CTLRX (that is, CTLRX=H) and a high logic-level transmission control signal CTLTX (that is, CTLTX=H).

Referring to FIG. 2, FIG. 3A, FIG. 3B, and Table 1, when the microprocessor 170 indicates entering of a low power consumption mode, the microprocessor 170 reduces the clock frequency, for example, adjusting the frequency from 400 MHz to 133 MHz. Next, the microprocessor 170 generates a command address bit CA and the register setting code CR according to a change in the frequency (as shown in Table 1). The command address bit CA includes at least an address space bit AS, and the register setting code CR includes at least the set mode CR[15] and the delay count CR[7:4]. The pseudo static random access memory 110 receives the command address bit CA, and enables a fast mode circuit 140 or a slow mode circuit 150 according to the command address bit CA and the register setting code CR.

Therefore, referring to FIG. 1, FIG. 2, FIG. 3A, FIG. 3B, and Table 1, the controller 120 may adjust the power supply voltage VDDQ and clock frequencies of the differential clock signal CK and the differential clock signal CK# according to the operation mode of the memory device 10, and generate a register setting code CR corresponding to an adjusted power supply voltage VDDQ and an adjusted clock frequency. Next, the pseudo static random access memory 110 may enable one of the fast mode circuit 140 and the slow mode circuit 150 according to the register setting code CR, and disable the other of the fast mode circuit 140 and the slow mode circuit 150. Further, the pseudo static random access memory 110 enables one of the fast mode circuit 140 and the slow mode circuit 150 and disables the other of the fast mode circuit 140 and the slow mode circuit 150 according to the input control signal CTLRX.

In detail, when determining, according to the register setting code CR, that the input/output circuit 130 is set to the fast mode (that is, CTLRX=H), the pseudo static random access memory 110 enables the fast mode circuit 140 and disables the slow mode circuit 150. When determining, according to the register setting code CR, that the input/output circuit 130 is set to the slow mode (that is, CTLRX=L), the pseudo static random access memory 110 enables the slow mode circuit 150 and disables the fast mode circuit 140.

Figure 4:
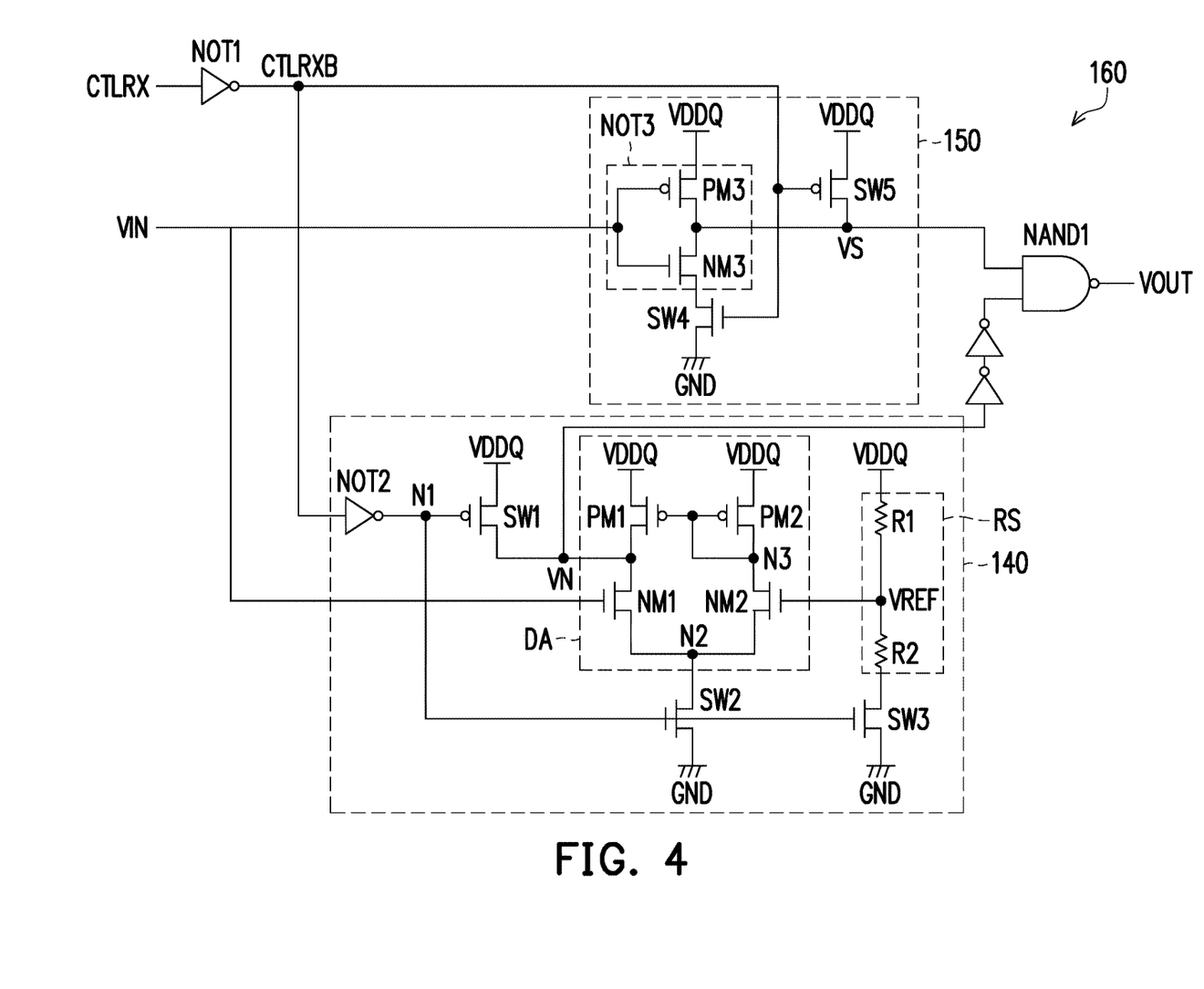
FIG. 4 is a circuit block diagram of an address latch and decoding circuit according to an embodiment of the invention.

For FIG. 4, an input receiver 160 includes an inverter NOT1, a fast mode circuit 140, a slow mode circuit 150, and a NAND gate NAND1. The inverter NOT1 receives and inverts an input control signal CTLRX to generate an inverted input control signal CTLRXB. The fast mode circuit 140 is coupled to the inverter NOT1, and the fast mode circuit 140 receives the inverted input control signal CTLRXB and an input signal VIN to generate a fast mode voltage VN. The slow mode circuit 150 is coupled to the inverter NOT1 and configured to receive the inverted input control signal CTLRXB and the input signal VIN to generate a slow mode voltage VS. The NAND gate NAND1 is coupled to the fast mode circuit 140 and the slow mode circuit 150, and the NAND gate NAND1 performs a NAND operation on the fast mode voltage VN and the slow mode voltage VS to generate an output signal VOUT. When it is determined that the input/output circuit 130 is operated in a fast mode, the inverted input control signal CTLRXB enables the fast mode circuit 140 and disables the slow mode circuit 150. When it is determined that the input/output circuit 130 is operated in a slow mode, the inverted input control signal CTLRXB disables the fast mode circuit 140 and enables the slow mode circuit 150.

The fast mode circuit 140 includes an inverter NOT2, a switch SW1, a differential amplifier DA, a series resistor RS, a switch SW2, and a switch SW3. The inverter NOT2 is coupled to the inverter NOT1, and the inverter NOT2 receives the inverted input control signal CTLRXB to generate a node voltage N1. A first terminal of the first switch SW1 is coupled to a power supply voltage VDDQ, a control terminal of the first switch SW1 is coupled to the node voltage N1, and a second terminal of the first switch SW1 is coupled to the fast mode voltage VN. The differential amplifier DA includes a transistor NM1, a transistor NM2, and a current mirror load. The current mirror load includes a transistor PM1 and a transistor PM2. A first terminal of the transistor NM1 is coupled to the fast mode voltage VN, a control terminal of the transistor NM1 is coupled to the input signal VIN, and a second terminal of the transistor NM1 is coupled to a node voltage N2. A first terminal of the transistor NM2 is coupled to a node voltage N3, a control terminal of the transistor NM2 receives a reference voltage VREF generated by the series resistor RS through voltage division, and a second terminal of the transistor NM2 is coupled to the node voltage N2. A first terminal of the transistor PM1 is coupled to the power supply voltage VDDQ, a control terminal of the transistor PM1 is coupled to the node voltage N3, and a second terminal of the transistor PM1 is coupled to the fast mode voltage VN. A first terminal of the transistor PM2 is coupled to the power supply voltage VDDQ, a control terminal of the transistor PM2 is coupled to the node voltage N3, and a second terminal of the transistor PM2 is coupled to the node voltage N3. The series resistor RS includes a first resistor R1 and a second resistor R2. The series resistor RS performs voltage division by using the first resistor R1 and the second resistor R2 to generate the reference voltage VREF. A first terminal of the series resistor RS is coupled to the power supply voltage VDDQ, a second terminal of the series resistor RS is coupled to the switch SW3, and a voltage dividing terminal of the series resistor RS is coupled to the control terminal of the transistor NM2. The first resistor R1 is coupled between the power supply voltage VDDQ and the reference voltage VREF, and the second resistor R2 is coupled between the reference voltage VREF and the switch SW3. A first terminal of the switch SW2 is coupled to the node voltage N2 in the differential amplifier DA, a control terminal of the switch SW2 is coupled to the node voltage N1, and a second terminal of the switch SW2 is coupled to a grounding voltage GND. A first terminal of the switch SW3 is coupled to the second resistor R2, a control terminal of the switch SW3 is coupled to the node voltage N1, and a second terminal of the switch SW3 is coupled to the grounding voltage GND.

In detail, when the input control signal CTLRX is at a high logic level (that is, CTLRX=H), because the inverted input control signal CTLRXB is at a low logic level (that is, CTLRXB=L), the node voltage N1 in the fast mode circuit 140 is at the high logic level, so that the switch SW1 is not turned on, and the switches SW2 and SW3 are turned on to the grounding voltage GND. Therefore, the series resistor RS may divide the power supply voltage VDDQ to generate the reference voltage VREF, and the differential amplifier DA generates the fast mode voltage VN by comparing the input signal VIN to the reference voltage VREF. In contrast, because the input control signal CTLRX is at the high logic level (that is, CTLRX=H) and the inverted input control signal CTLRXB is at the low logic level (that is, CTLRXB=L), a switch SW4 in the slow mode circuit 150 is not turned on but a switch SW5 is turned on, so that the slow mode voltage VS is fixed at the high logic level. Therefore, when the input control signal CTLRX is at the high logic level (that is, CTLRX=H), the fast mode circuit 140 receives the input signal VIN to generate the fast mode voltage VN, and the NAND gate NAND1 perform a NAND operation on the fast mode voltage VN generated by using the input signal VIN and the slow mode voltage VS fixed at the high logic level, to generate an output signal VOUT.

The slow mode circuit 150 includes an inverter NOT3, the switch SW4, and the switch SW5. A first terminal of the inverter NOT3 is coupled to the power supply voltage VDDQ, an input terminal of the inverter NOT3 is coupled to the input signal VIN, and an output terminal of the inverter NOT3 is coupled to the slow mode voltage VS. The inverter NOT3 is composed of a transistor PM3 and a transistor NM3. A first terminal of the switch SW4 is coupled to the second terminal of the inverter NOT3, a control terminal of the switch SW4 receives the inverted input control signal CTLRXB, and a second terminal of the switch SW4 is coupled to the grounding voltage GND. A first terminal of the switch SW5 is coupled to the power supply voltage VDDQ, a control terminal of the switch SW5 receives the inverted input control signal CTLRXB, and a second terminal of the switch SW5 is coupled to the slow mode voltage VS.

In detail, when the input control signal CTLRX is at the low logic level (that is, CTLRX=L), because the inverted input control signal CTLRXB is at the high logic level (that is, CTLRXB=H), the node voltage N1 in the fast mode circuit 140 is at the low logic level. Therefore, the switch SW1 is turned on to cause the fast mode voltage VN is fixed at the high logic level, and the switches SW2 and SW3 are not turned on, and the series resistor RS cannot divide the power supply voltage VDDQ to generate the reference voltage VREF. In contrast, because the input control signal CTLRX is at the low logic level (that is, CTLRX=L) and the inverted input control signal CTLRXB is at the high logic level (that is, CTLRXB=H), the switch SW4 in the slow mode circuit 150 is turned on and the switch SW5 is not turned on, so that the inverter NOT3 inverts the input signal VIN to output the slow mode voltage VS. Therefore, when the input control signal CTLRX is at the low logic level (that is, CTLRX=L), the slow mode circuit 150 receives the input signal VIN to generate the slow mode voltage VS, and the NAND gate NAND1 performs a NAND operation on the fast mode voltage VN fixed at the high logic level and the slow mode voltage VS generated by using the input signal VIN to generate an output signal VOUT.

It needs to be noted that the slow mode circuit 150 is enabled in the slow mode (that is, CTLRX=L), compared to that the fast mode circuit 140 is enabled in the fast mode (that is, CTLRX=H), the input signal VIN in the slow mode circuit 150 in the slow mode goes through one more delay of the inverter (that is, inverter NOT3) than an input signal in the fast mode circuit 140 in the fast mode. It needs to be noted that the present embodiment is only an example, and the invention does not limit a number of inverters that generate a delay. Therefore, in the slow mode (that is, CTLRX=L), although an input/output response of the input receiver 160 is relatively slow, current consumption of the input receiver is less than current consumption in the fast mode circuit 140, thereby prolonging a battery life.

Figure 5:
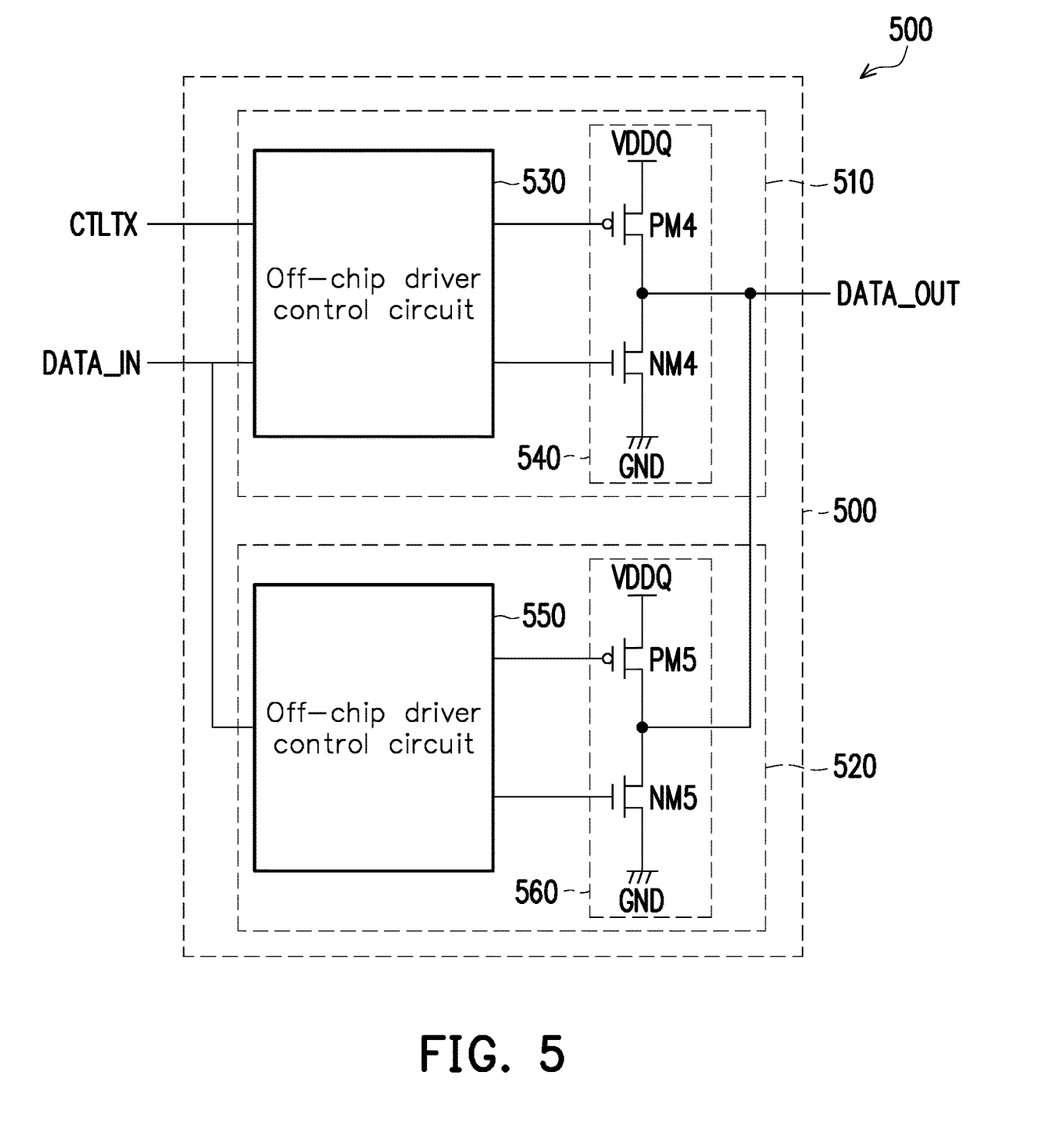
FIG. 5 is a schematic diagram of an off-chip driver according to an embodiment of the invention.

Referring to FIG. 5, the memory device 10 further includes an off-chip driver (OCD) 500. The off-chip driver 500 is configured at least in an input/output circuit 130 and includes a data strobe signal DQS (not shown) and a data bus DQ. The off-chip driver 500 includes a first off-chip driver 510 and a second off-chip driver 520. The off-chip driver 500 is configured to buffer input data DATA_IN according to a transmission control signal CTLTX to generate output data DATA_OUT. The first off-chip driver 510 receives an input control signal CTLRX, and the first off-chip driver 510 is enabled or disabled according to the transmission control signal CTLTX. The second off-chip driver 520 is configured to be operated constantly. The off-chip driver 500 is configured to dynamically adjust, according to the transmission control signal CTLTX, a current driving force buffered from the input data DATA_IN to the output data DATA_OUT, and then provide the output data DATA_OUT after the current driving force is adjusted to the data bus DQ.

In detail, the first off-chip driver 510 includes an off-chip driver control circuit 530 and an output stage 540. The off-chip driver control circuit 530 receives the transmission control signal CTLTX and the input data DATA_IN, and the off-chip driver control circuit 530 is enabled or disabled according to the transmission control signal CTLTX to adjust a voltage provided to the output stage 540. The output stage 540 includes a transistor PM4 and a transistor NM4 configured to generate output data DATA_OUT according to the voltage provided by the off-chip driver control circuit 530. In addition, the second off-chip driver 520 includes an off-chip driver control circuit 550 and an output stage 560. The off-chip driver control circuit 550 receives the input data DATA_IN configured to adjust a voltage provided to the output stage 560. The output stage 560 includes a transistor PM5 and a transistor NM5 configured to generate output data DATA_OUT according to the voltage provided by the off-chip driver control circuit 550.

In detail, when determining, according to the register setting code CR, that the input/output circuit 130 is set to a fast mode, the pseudo static random access memory 110 enables the first off-chip driver 510 according to the transmission control signal CTLTX. When determining, according to the register setting code CR, that the input/output circuit 130 is set to a slow mode, the pseudo static random access memory 110 disables the first off-chip driver 510 according to the transmission control signal CTLTX. Because the second off-chip driver 520 is configured to be operated constantly, both the first off-chip driver 510 and the second off-chip driver 520 are enabled in the fast mode, but only the second off-chip driver 520 is enabled in the slow mode. In other words, the off-chip driver 500 may adjust the current driving force of data input/output by using the register setting code CR, so as to provide an optimal DQ bus driving capability according to the fast mode or the slow mode.

Figure 6:
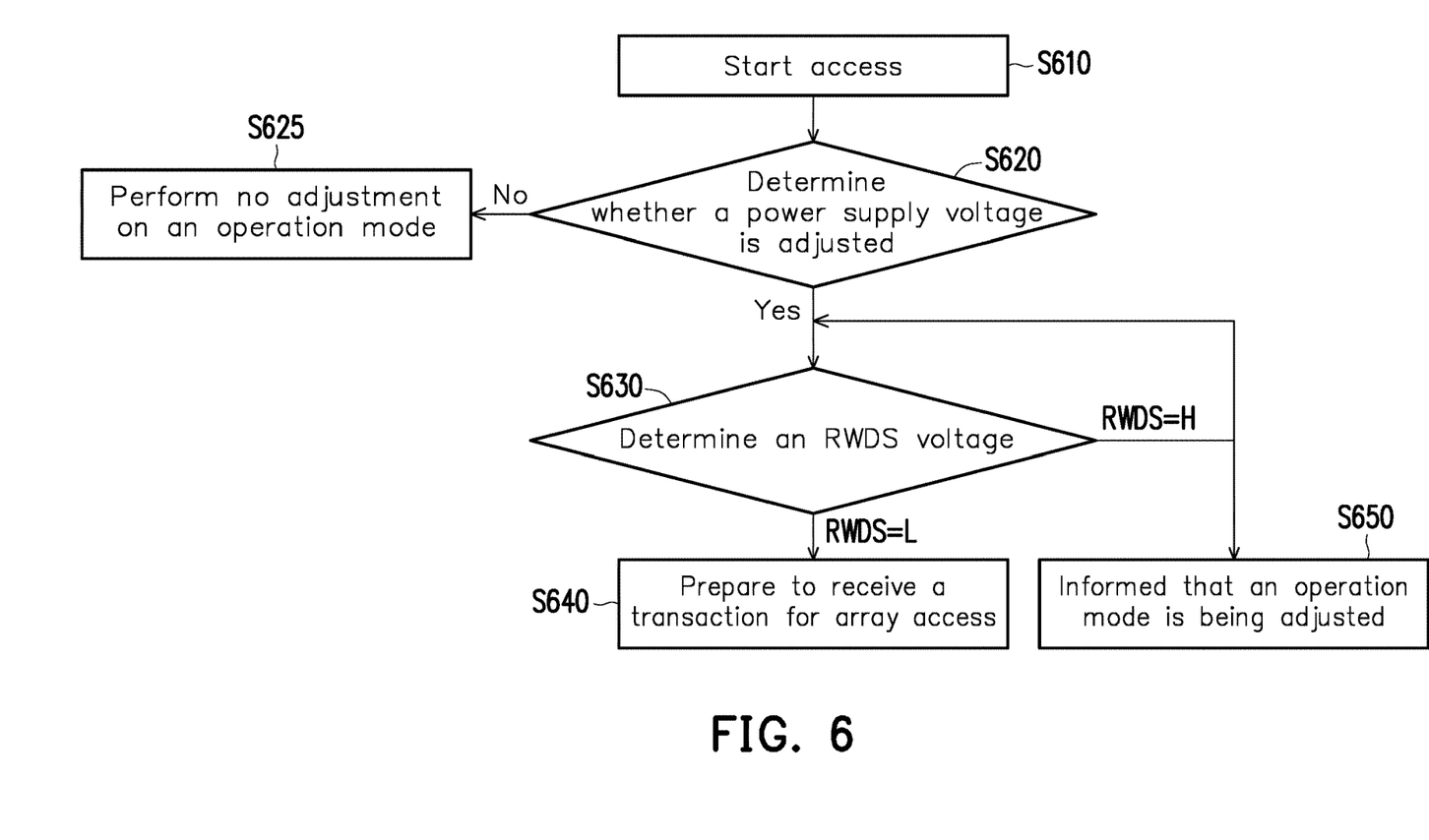
FIG. 6 is a flowchart of a continuous read-write method according to an embodiment of the invention.

Referring to FIG. 2 and FIG. 6, the read-write data strobe signal RWDS is used to cause the microprocessor 170 to learn a state change of the operation mode of the pseudo static random access memory 110. Because it takes a transition time to update the power supply voltage VDDQ, during waiting for the transition time, the pseudo static random access memory 110 may use the read-write data strobe signal RWDS to inform the microprocessor 170 of the operation mode of the pseudo static random access memory 110. In detail, in step S610, the pseudo static random access memory 110 starts access. Next, in step S620, it is determined whether the power supply voltage VDDQ is adjusted. If the power supply voltage VDDQ is not adjusted, perform step S625. If the power supply voltage VDDQ is adjusted, perform step S630. In step S630, a logic level of the read-write data strobe signal RWDS is controlled. When the read-write data strobe signal RWDS is at a low logic level (that is, RWDS=L), perform step S640. When the read-write data strobe signal RWDS is at a high logic level (that is, RWDS=H), step S630 is returned and S650 is performed, to inform that the power supply voltage VDDQ of microprocessor 170 is being adjusted. In step S640, it is informed that the microprocessor 170 is ready to receive a transaction for array access. In step S650, it is informed that a current operation mode of the microprocessor 170 is being adjusted.

Figure 7:
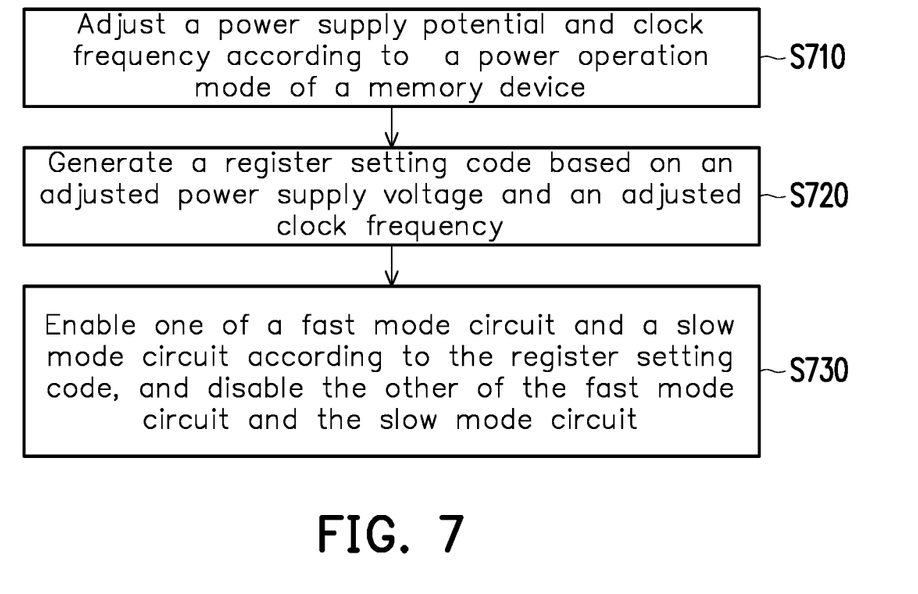
FIG. 7 is a flowchart of a method for input/output buffer control according to an embodiment of the invention.

Referring to FIG. 7, in step S710, a controller 120 adjusts a power supply voltage VDDQ and a clock frequency according to an operation mode of a memory device 10. Next, in step S720, the controller 120 generates a register setting code CR based on an adjusted power supply voltage VDDQ and an adjusted clock frequency. In step S730, the pseudo static random access memory 110 enables one of a fast mode circuit 140 and a slow mode circuit 150 according to the register setting code CR, and disables the other of the fast mode circuit 140 and the slow mode circuit 150.

Based on the foregoing, in the embodiments of the invention, the memory device and the method for input/output buffer control thereof are used to adjust the power supply voltage and the clock frequency according to the operation mode, and generate the register setting code based on the adjusted power supply voltage and the adjusted clock frequency, and enable the fast mode circuit or the slow mode circuit in the input/output circuit according to the register setting code to dynamically adjust an access time of the input/output circuit. In addition, the current driving force of the data of the off-chip driver through the register setting code. What's more, the microprocessor may be informed of a state change of the power supply voltage. According to the invention, the input/output circuit may be controlled optimally through the operation mode to more rapidly prolong the battery life.

Although the present invention is disclosed in embodiments above, the present invention is not limited thereto. A person of ordinary skill in the art may make a little variations and modifications without departing from the spirit and scope of the present invention. Therefore, the protection scope of the present invention should be subject to the claims.

What is claimed is:

1. A memory device comprising:
   a pseudo static random access memory comprising an input/output circuit having a fast mode circuit and a slow mode circuit; and
   a controller coupled to the pseudo static random access memory and configured to adjust a power supply voltage and a clock frequency according to an operation mode of the memory device, and generate a register setting code based on an adjusted power supply voltage and an adjusted clock frequency, wherein
   the pseudo static random access memory enables one of the fast mode circuit and the slow mode circuit according to the register setting code, and disables the other of the fast mode circuit and the slow mode circuit.

2. The memory device according to claim 1, wherein
   when determining, according to the register setting code, that the input/output circuit is set to a fast mode, the pseudo static random access memory enables the fast mode circuit and disables the slow mode circuit, and
   when determining, according to the register setting code, that the input/output circuit is set to a slow mode, the pseudo static random access memory enables the slow mode circuit and disables the fast mode circuit.

3. The memory device according to claim 1, wherein the register setting code comprises a set mode or a delay count.

4. The memory device according to claim 1, wherein the pseudo static random access memory further comprises a command decoder configured to receive and decode the register setting code to generate an input control signal and a transmission control signal.

5. The memory device according to claim 4, wherein the pseudo static random access memory enables one of the fast mode circuit and the slow mode circuit according to the input control signal, and disables the other of the fast mode circuit and the slow mode circuit.

6. The memory device according to claim 1, wherein the controller further comprises:
   a microprocessor coupled to the pseudo static random access memory, wherein the microprocessor generates a power supply management control signal and adjusts the clock frequency according to the operation mode of the memory device, and generates the register setting code according to a change in the clock frequency, wherein there are a data bus and a read-write data strobe signal between the microprocessor and the pseudo static random access memory;
   a power supply management circuit coupled to the microprocessor, wherein the power supply management circuit generates a power supply control signal according to the power supply management control signal; and
   a power supply circuit coupled to the pseudo static random access memory, the microprocessor, and the power supply management circuit, wherein the power supply circuit generates a power supply voltage according to the power supply control signal and provides the power supply voltage to the microprocessor and the pseudo static random access memory.

7. The memory device according to claim 4, wherein the input/output circuit further comprises an input receiver, and the input receiver comprises:
   a first inverter configured to receive and invert the input control signal to generate an inverted input control signal;
   a fast mode circuit coupled to the first inverter and configured to receive the inverted input control signal and an input signal to generate a fast mode voltage;
   a slow mode circuit coupled to the first inverter and configured to receive the inverted input control signal and the input signal to generate a slow mode voltage; and a NAND gate coupled to the fast mode circuit and the slow mode circuit, and configured to receive the fast mode voltage and the slow mode voltage and perform a NAND logic operation on the fast mode voltage and the slow mode voltage to generate an output signal.

8. The memory device according to claim 7, wherein the fast mode circuit comprises:
a second inverter coupled to the first inverter and configured to receive the inverted input control signal to generate a first node voltage;
a first switch, wherein a first terminal of the first switch is coupled to a power supply voltage, a control terminal of the first switch is coupled to the first node voltage, and a second terminal of the first switch is coupled to the fast mode voltage;
a differential amplifier having a current mirror load and configured to receive the input signal to generate the fast mode voltage;
a series resistor, wherein a first terminal of the series resistor is coupled to the power supply voltage, the series resistor comprises a first resistor and a second resistor and generates a reference voltage through a voltage dividing operation, and the first resistor is coupled between the power supply voltage and the reference voltage;
a second switch, wherein a first terminal of the second switch is coupled to the differential amplifier, a control terminal of the second switch is coupled to the first node voltage, and a second terminal of the second switch is coupled to a grounding voltage; and
a third switch, wherein a first terminal of the third switch is coupled to the second resistor, a control terminal of the third switch is coupled to the first node voltage, and a second terminal of the third switch is coupled to the grounding voltage.

9. The memory device according to claim 7, wherein the slow mode circuit comprises:
a third inverter, wherein a first terminal of the third inverter is coupled to the power supply voltage, an input terminal of the third inverter is coupled to the input signal, and an output terminal of the third inverter is coupled to the slow mode voltage;
a fourth switch, wherein a first terminal of the fourth switch is coupled to a second terminal of the third inverter, a control terminal of the fourth switch receives the inverted input control signal, and a second terminal of the fourth switch is coupled to a grounding voltage; and a fifth switch, wherein a first terminal of the fifth switch is coupled to the power supply voltage, a control terminal of the fifth switch receives the inverted input control signal, and a second terminal of the fifth switch is coupled to the slow mode voltage.

10. The memory device according to claim 4, wherein the memory device further comprises an off-chip driver, and the off-chip driver comprises:
a first off-chip driver receiving the input control signal and configured to be enabled or disabled according to the transmission control signal; and
a second off-chip driver configured to be constantly on, wherein
the off-chip driver is configured to dynamically adjust a current driving force of the off-chip driver according to the transmission control signal.

11. The memory device according to claim 10, wherein when determining, according to the register setting code, that the input/output circuit is set to a fast mode, the pseudo static random access memory enables the first off-chip driver according to the transmission control signal, and
when determining, according to the register setting code, that the input/output circuit is set to a slow mode, the pseudo static random access memory disables the first off-chip driver according to the transmission control signal.

12. The memory device according to claim 6, wherein the read-write data strobe signal is used to cause the microprocessor to learn the operation mode of the pseudo static random access memory.

13. A method for input/output buffer control adapted for a memory device, wherein the memory device comprises a pseudo static random access memory and a controller, the pseudo static random access memory comprises an input/output circuit having a fast mode circuit and a slow mode circuit, and the method for input/output buffer control comprises:
adjusting a power supply voltage and a clock frequency according to an operation mode of the memory device;
generating a register setting code based on an adjusted power supply voltage and an adjusted clock frequency; and
enabling one of the fast mode circuit and the slow mode circuit according to the register setting code, and disabling the other of the fast mode circuit and the slow mode circuit.

* * * * *